United States Patent
Mehlhorn

(10) Patent No.: US 6,989,649 B2
(45) Date of Patent: Jan. 24, 2006

(54) SWITCH ASSEMBLY, ELECTRIC MACHINE HAVING THE SWITCH ASSEMBLY, AND METHOD OF CONTROLLING THE SAME

(75) Inventor: William L. Mehlhorn, Menomonee Falls, WI (US)

(73) Assignee: A. O. Smith Corporation, Milwaukee, WI (US)

( * ) Notice: Subject to any disclaimer, the term of this patent is extended or adjusted under 35 U.S.C. 154(b) by 202 days.

(21) Appl. No.: 10/615,815

(22) Filed: Jul. 9, 2003

(65) Prior Publication Data

US 2005/0007062 A1 Jan. 13, 2005

(51) Int. Cl.
*H02P 7/00* (2006.01)
*H02P 7/09* (2006.01)

(52) U.S. Cl. ............... 318/806; 318/805; 318/812; 361/33

(58) Field of Classification Search ......... 318/362, 318/375, 376, 785, 751, 772, 774, 779, 798, 318/787, 716, 805, 599, 612; 315/291; 173/217, 173/216; 363/89, 59; 323/237, 282
See application file for complete search history.

(56) References Cited

U.S. PATENT DOCUMENTS

| | | | |
|---|---|---|---|
| 3,530,348 A | 9/1970 | Conner | |
| 3,562,614 A | 2/1971 | Gramkow | |
| 3,566,225 A | 2/1971 | Poulsen | |
| 3,593,081 A | 7/1971 | Forst | |
| 3,594,623 A | * 7/1971 | Lamaster | 318/137 |
| 3,596,158 A | * 7/1971 | Watrous | 318/809 |
| 3,624,470 A | 11/1971 | Johnson | |
| 3,652,912 A | * 3/1972 | Bordonaro | 318/599 |
| 3,671,830 A | 6/1972 | Kruper | |
| 3,761,792 A | 9/1973 | Whitney et al. | |
| 3,777,232 A | 12/1973 | Woods et al. | |
| 3,792,324 A | 2/1974 | Suarez et al. | |
| 3,882,364 A | 5/1975 | Wright et al. | |
| 3,976,919 A | * 8/1976 | Vandevier et al. | 361/96 |
| 4,000,446 A | * 12/1976 | Vandevier et al. | 361/31 |
| 4,021,700 A | * 5/1977 | Ellis-Anwyl | 361/28 |
| 4,303,203 A | * 12/1981 | Avery | 239/728 |
| 4,307,327 A | 12/1981 | Streater et al. | |
| 4,366,426 A | 12/1982 | Turlej | |
| 4,370,690 A | 1/1983 | Baker | |
| 4,375,613 A | 3/1983 | Fuller et al. | |
| 4,399,394 A | 8/1983 | Ballman | |
| 4,409,532 A | 10/1983 | Hollenbeck et al. | |
| 4,437,133 A | * 3/1984 | Rueckert | 361/33 |
| 4,453,118 A | 6/1984 | Phillips et al. | |
| 4,463,304 A | 7/1984 | Miller | |
| 4,468,604 A | 8/1984 | Zaderej | |
| 4,496,895 A | 1/1985 | Kawate et al. | |
| 4,520,303 A | 5/1985 | Ward | |
| 4,604,563 A | 8/1986 | Min | |
| 4,605,888 A | 8/1986 | Kim | |
| 4,622,506 A | 11/1986 | Shemanske et al. | |
| 4,651,077 A | 3/1987 | Woyski | |
| 4,658,195 A | 4/1987 | Min | |
| 4,658,203 A | * 4/1987 | Freymuth | 323/282 |

(Continued)

*Primary Examiner*—Paul Ip
(74) *Attorney, Agent, or Firm*—Michael Best & Friedrich LLP

(57) ABSTRACT

A switch assembly including a switch (e.g., an electronic switch) and a controller connected to the switch to control the switch. The switch assembly can also include a power supply connectable to a power source and connected to the controller. The power supply is configured to receive power from the power source and controllably power the controller. The switch assembly can also include a generator and decision logic. The switch assembly can be used in an electric machine (e.g., a motor).

54 Claims, 6 Drawing Sheets

U.S. PATENT DOCUMENTS

| | | | |
|---|---|---|---|
| 4,670,697 A | 6/1987 | Wrege et al. | |
| 4,719,399 A | 1/1988 | Wrege | |
| 4,751,449 A | 6/1988 | Chmiel | |
| 4,751,450 A | 6/1988 | Lorenz et al. | |
| 4,761,601 A | 8/1988 | Zaderej | |
| 4,764,417 A | 8/1988 | Gulya | |
| 4,782,278 A | 11/1988 | Bossi et al. | |
| 4,786,850 A | 11/1988 | Chmiel | |
| 4,801,858 A | 1/1989 | Min | |
| 4,804,901 A | 2/1989 | Pertessis et al. | |
| 4,820,964 A | 4/1989 | Kadah et al. | |
| 4,843,295 A | 6/1989 | Thompson et al. | |
| 4,862,053 A | 8/1989 | Jordan et al. | |
| 4,958,118 A | 9/1990 | Pottebaum | |
| 4,967,131 A | 10/1990 | Kim | |
| 4,975,798 A * | 12/1990 | Edwards et al. | 361/56 |
| 5,017,853 A | 5/1991 | Chmiel | |
| 5,041,771 A | 8/1991 | Min | |
| 5,051,681 A | 9/1991 | Schwarz | |
| 5,076,761 A * | 12/1991 | Krohn et al. | 417/18 |
| 5,091,817 A * | 2/1992 | Alley et al. | 361/56 |
| 5,103,154 A | 4/1992 | Dropps et al. | |
| 5,164,651 A | 11/1992 | Hu et al. | |
| 5,206,573 A | 4/1993 | McCleer et al. | |
| 5,245,272 A * | 9/1993 | Herbert | 323/300 |
| 5,296,795 A | 3/1994 | Dropps et al. | |
| 5,302,885 A | 4/1994 | Schwarz et al. | |
| 5,444,354 A * | 8/1995 | Takahashi et al. | 322/28 |
| 5,495,161 A | 2/1996 | Hunter | |
| 5,512,809 A | 4/1996 | Banks et al. | |
| 5,528,120 A | 6/1996 | Brodetsky | |
| 5,532,635 A * | 7/1996 | Watrous et al. | 327/310 |
| 5,550,497 A * | 8/1996 | Carobolante | 327/110 |
| 5,559,418 A | 9/1996 | Burkhart | |
| 5,561,357 A | 10/1996 | Schroeder | |
| 5,563,759 A * | 10/1996 | Nadd | 361/101 |
| 5,589,753 A | 12/1996 | Kadah et al. | |
| 5,592,062 A * | 1/1997 | Bach | 318/805 |
| 5,618,460 A * | 4/1997 | Fowler et al. | 219/497 |
| 5,654,620 A * | 8/1997 | Langhorst | 318/716 |
| 5,736,884 A * | 4/1998 | Ettes et al. | 327/304 |
| 5,754,036 A * | 5/1998 | Walker | 323/237 |
| 5,814,966 A * | 9/1998 | Williamson et al. | 318/798 |
| 5,818,708 A * | 10/1998 | Wong | 363/89 |
| 5,892,349 A * | 4/1999 | Bogwicz et al. | 318/772 |
| 5,973,473 A * | 10/1999 | Anderson et al. | 318/785 |
| 6,222,355 B1 * | 4/2001 | Ohshima et al. | 323/282 |
| 6,232,742 B1 | 5/2001 | Wacknov et al. | |
| 6,236,177 B1 * | 5/2001 | Zick et al. | 318/362 |
| 6,320,348 B1 | 11/2001 | Kadah | |
| 6,329,784 B1 | 12/2001 | Puppin et al. | |
| 6,356,464 B1 * | 3/2002 | Balakrishnan et al. | 363/21.01 |
| 6,366,481 B1 * | 4/2002 | Balakrishnan et al. | 363/21.15 |
| 6,411,481 B1 * | 6/2002 | Seubert | 361/91.1 |
| 6,462,971 B1 * | 10/2002 | Balakrishnan et al. | 363/95 |
| 6,496,392 B2 * | 12/2002 | Odell | 363/56.11 |
| 6,538,908 B2 * | 3/2003 | Balakrishnan et al. | 363/95 |
| 6,643,153 B2 * | 11/2003 | Balakrishnan et al. | 363/95 |
| 6,665,200 B2 * | 12/2003 | Goto et al. | 363/55 |
| 6,675,912 B2 * | 1/2004 | Carrier | 173/217 |
| 6,687,141 B2 * | 2/2004 | Odell | 363/56.11 |
| 6,700,333 B1 * | 3/2004 | Hirshi et al. | 315/291 |
| 6,737,905 B1 * | 5/2004 | Noda et al. | 327/323 |
| 6,794,921 B2 * | 9/2004 | Abe et al. | 327/309 |
| 2002/0101193 A1 * | 8/2002 | Farkas et al. | 315/291 |
| 2002/0163821 A1 * | 11/2002 | Odell | 363/56.11 |
| 2002/0172055 A1 * | 11/2002 | Balakrishnan et al. | 363/16 |
| 2003/0034761 A1 * | 2/2003 | Goto et al. | 323/282 |
| 2003/0048646 A1 * | 3/2003 | Odell | 363/56.11 |
| 2004/0071001 A1 * | 4/2004 | Balakrishnan et al. | 363/95 |
| 2004/0080352 A1 * | 4/2004 | Noda et al. | 327/321 |
| 2004/0095183 A1 * | 5/2004 | Swize | 327/423 |

* cited by examiner

US 6,989,649 B2

SWITCH ASSEMBLY, ELECTRIC MACHINE HAVING THE SWITCH ASSEMBLY, AND METHOD OF CONTROLLING THE SAME

FIELD OF THE INVENTION

The present invention relates to an electronic switch assembly and, more particularly, an electronic switch assembly that controls current through a circuit such as an auxiliary circuit (e.g., an auxiliary start circuit) of an electric machine.

BACKGROUND

Single-phase induction motors of the split phase and capacitor start types typically have the start winding connected to the power source when starting the motor. Once started, however, it is common to remove the start winding, resulting in the motor being more efficient. One reason for the removal of the start winding and start capacitor (if present) is that the start winding and the start capacitor are not typically designed for continuous duty. That is, these components will fail if left permanently in the circuit. A common solution to this problem is connecting an electronic switch circuit in series with the start winding (and start capacitor) for controlling current through the start winding.

The most common implementation of a start switch for the above motors is a centrifugal switch mounted on the shaft of the motor. The centrifugal switch senses the shaft speed of the motor and opens the start winding contacts at the appropriate speed. This speed is typically around 75% to 80% of the rated running speed of the motor.

There are some problems associated with a motor including a centrifugal switch. Because the switch is opening an inductive load, a large spark occurs when the contacts open. This sparking pits the switch contacts and ultimately results in the switch failing. Another problem with the mechanical switch is that it must be adjusted in production to get an accurate switch-out speed. This is another step in the production process, which adds cost. Also, if adjustment difficulties arise, this step can slow production of the motor. Another frequently cited problem is that the switch must be mounted on the shaft of the motor and, thus, limits packaging options. The switch assembly adds length to the motor, which makes motor placement in tight quarters more challenging. A lesser problem is that the switch makes noise when it opens and closes. Some users may find the noise objectionable.

SUMMARY

One alternative to a motor including a centrifugal start switch is a motor having an electronic start switch. In one embodiment, the invention provides a new and useful electronic switch assembly used to control the current through a circuit. As used herein, a circuit is a conductor or system of conductors through which an electric current can or is intended to flow. An example circuit is the start winding and start capacitor (referred to herein as an auxiliary circuit) of a single-phase induction motor of the capacitor start type. However, the electronic assembly is not limited to induction motors of the capacitor start type.

In one construction of the electronic switch assembly, the assembly includes a power supply block, a switch control block, and a circuit control block. As used herein, a block is an assembly of circuits and/or components that function as a unit. The power supply block powers the electronic switch assembly. The switch control block includes an electronic switch and, generally speaking, opens (or closes) the switch based on a signal received from the circuit control block.

In another embodiment, the invention provides an electric machine (e.g., a motor) having a winding (e.g., a start winding) controlled by the electronic switch assembly. Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The terms "connected," "coupled," and "mounted" and variations thereof herein are used broadly and, unless otherwise stated, encompass both direct and indirect connections, couplings, and mountings. In addition, the terms connected and coupled and variations thereof herein are not restricted to physical and mechanical connections or couplings.

Figure 1:
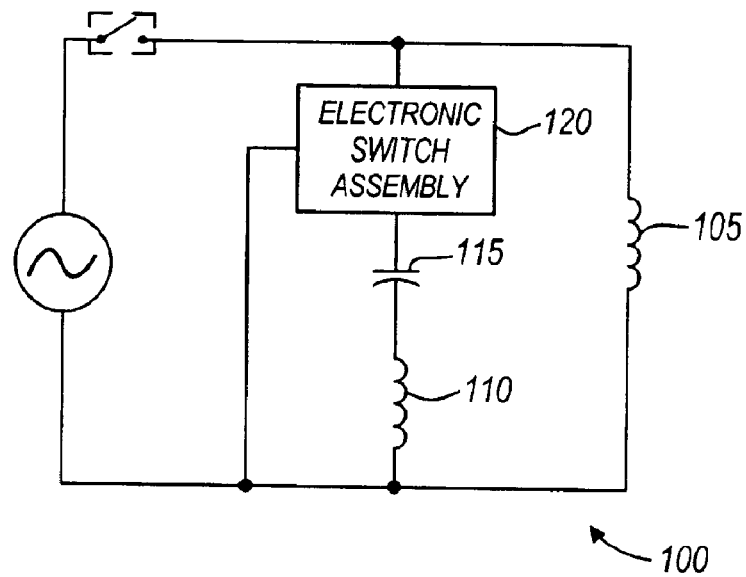
FIG. 1 is an electrical schematic of a motor including an electronic switch embodying the invention.

FIG. 1 schematically represents a single-phase, capacitor start induction motor 100. The motor 100 includes a main winding 105, a start winding 110, a start capacitor 115, and an electronic switch assembly 120. Unless specified otherwise, the description below will refer to the motor 100. However, the invention is not limited to the motor 100. For example, the electronic switch assembly 120 described below can be used with a single-phase, split-phase induction motor; a capacitor-start, capacitor-run induction motor, and similar induction motors. It is also envisioned that the electronic switch assembly 120 (or aspects of the switch assembly 120) can be used with other motor types and other electric machines, where the electronic switch assembly 120 controls current through a circuit of the motor or machine. It is even envisioned that the electronic switch assembly 120 (or aspects of the switch assembly) can be used with any circuit, where the switch assembly 120 controls current through the circuit.

With reference to FIG. 1, the main winding 105, the start winding 110, and the start capacitor 115 are conventional components of a capacitor-start, capacitor-run induction motor. It is envisioned that other components can be added to the motor 100, and FIG. 1 is meant only to be a representative induction motor capable of being used with the electronic switch assembly 120.

Figure 3:
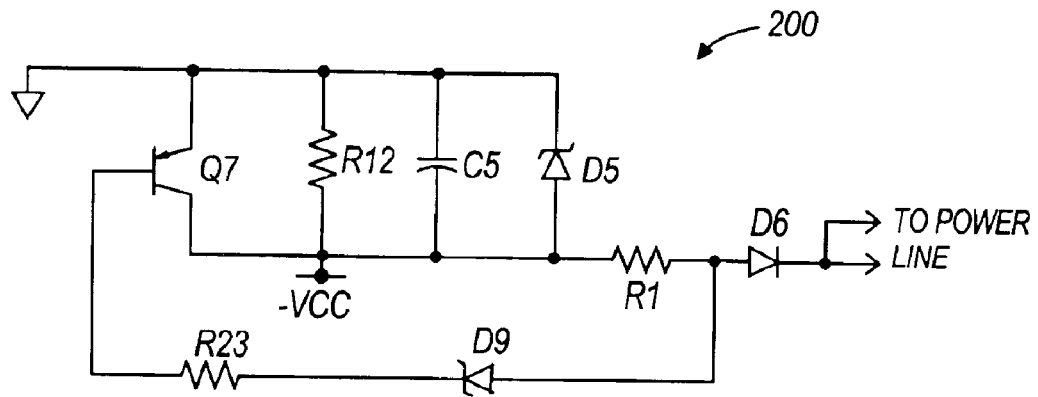
FIG. 3 is an electrical schematic of an exemplary power source capable of being used in the electronic switch assembly of FIG. 2.
Figure 2:
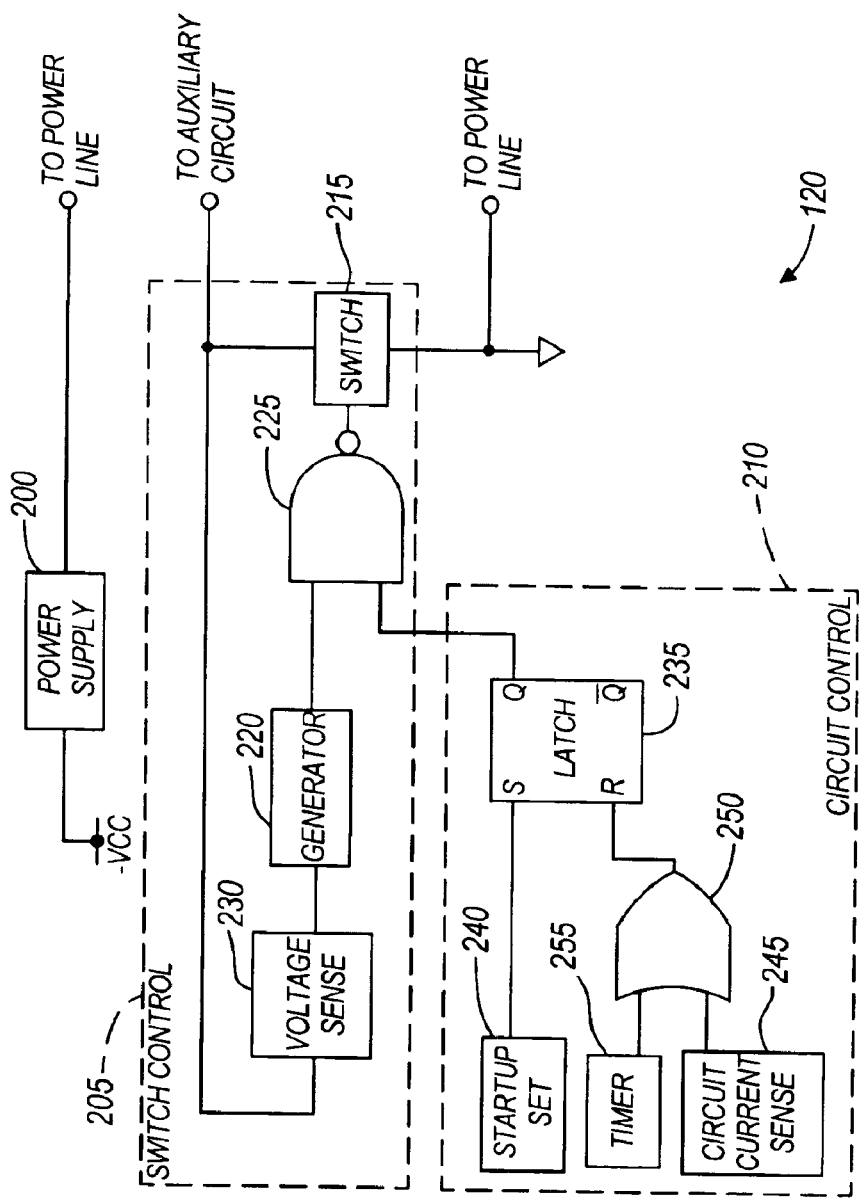
FIG. 2 is a block diagram of a representative electronic switch assembly capable of being used in the circuit shown in FIG. 1.
Figure 4:
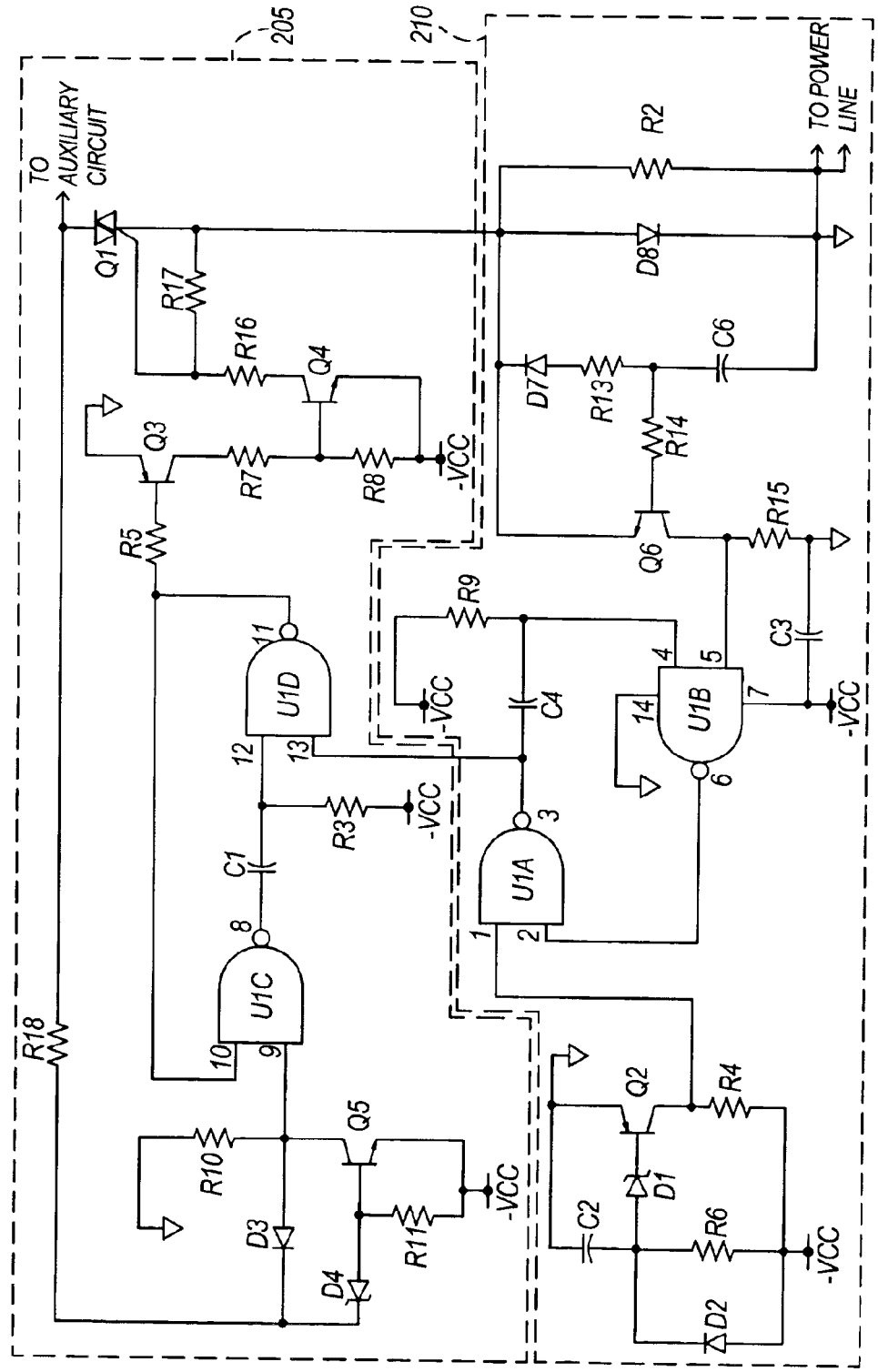
FIG. 4 is an electrical schematic of an exemplary switch control block and circuit control block capable of being used in the electronic switch assembly of FIG. 3.

FIG. 2 shows a block diagram of one construction of the electronic switch assembly 120. With reference to FIG. 2, the electronic switch assembly includes a power supply 200, a switch control block 205, and a circuit control clock 210. FIGS. 3 and 4 are detailed electric schematics showing one exemplary electronic switch assembly 120.

The power supply 200 receives power (e.g., 115 VAC or 230 VAC power) from a power source and provides a regulated (i.e., a constant or consistent) voltage. For the construction shown in FIG. 2, the power supply 200 is connected to the power line and provides a direct current (e.g., a −5 VDC) power.

FIG. 3 is a detailed schematic showing one exemplary power supply 200 capable of being used with the electronic switch 120. With reference to FIG. 3, the power supply 200 includes resistors R1, R12, and R23; capacitor C5; diode D6; Zener diodes D5 and D9; and transistor Q7. During operation, when a positive half-cycle voltage is across the power supply 200, diode D6 blocks current through the power supply. When a negative half-cycle voltage is across the power supply 200, diode D6 conducts causing current to flow through resistor R1, thereby charging capacitor C5. Zener diode D5 begins conducting when capacitor C5 achieves a voltage determined by the Zener diode D5, thereby limiting the voltage across capacitor C5. Resistor R5 dissipates the charge of capacitor C5 when power is removed from the power supply 200, allowing the electronic switch assembly 120 to reset.

One feature of the circuit shown in FIG. 3 is that the circuit prevents the electronic switch 120 from working should the motor 100 be hooked to the wrong supply voltage. To provide some background, motor manufactures frequently design motors for dual voltage operation (e.g., 115 or 230 VAC operation) to keep the number of different motor models produced to a minimum. A common mistake by technicians is to hook a 115 VAC configured motor to a 230 VAC power line. When power is applied to the motor, the electronic switch will perform as normal and the motor will start (if there were no voltage clamp circuit). When the switch circuit turns off the start winding, however, the triac will need to block a large voltage (e.g., 1200 V). The power supply clamp keeps the motor from starting and, thus, the triac is required to block a much relatively smaller voltage (e.g., 350 V). Because the motor did not start, the clamp circuit has the additional benefit of alerting the installer that something is wrong.

Referring once again to FIG. 3, transistor Q7, resistor R23, and Zener diode D9 form the power supply clamp circuit. More specifically, Zener diode D9 has a set reverse breakdown voltage (e.g. 200 VDC) that results in the Zener diode conducting when the voltage applied to the power supply 200 is greater than the designed motor voltage (e.g., 130 VAC). When Zener diode D9 conducts, transistor Q7 switches on, thereby shorting the power supply. This circuit prevents the electronic switch assembly 120 from working should the motor be hooked to the wrong supply voltage by keeping the power supply 200 from powering the circuit.

Referring again to FIG. 2, the electronic switch assembly 120 includes a switch control block 205. The switch control block 205 includes a switch 215 connected in series with the circuit to be controlled. For the construction shown, the switch 215 is connected in series with the start winding 110 and the start capacitor 115. The switch 215 can be any electronic switch that prevents/allows current through the switch 215 in response to a control signal. An example switch 215 is a triac. In one specific construction the electronic switch 215 is an "AC Switch" brand switch, Model No. ACST8-8C, produced by ST Microelectronics of France, which also provides a high voltage clamping device to the triac in the same package to give the triac better line transient immunity and ability to switch inductive loads. Unless specified otherwise, the switch 215 for the description below is a triac.

Referring again to the construction shown in FIG. 2, the switch control block 205 includes a generator 220, and NAND gate 225. The generator 220 provides a signal to the NAND gate 225, which compares the generated signal with a signal from the circuit control block 210 (described below). The result of the NAND gate 225 controls the switch 215. Before proceeding further, it should be noted that, while the electronic switch shown is described with the NAND gate 230, the circuit can be readily redesigned for other gate types.

When the switch 215 is a triac, the generator 225 can be a pulse generator and the switch control 205 can also includes a voltage sense circuit 230. Generally speaking, a triac is a bidirection gate controlled thyristor capable of conducting in either direction in response to a pulse. Therefore, the triac does not require a fixed control (or gate) voltage to allow current through the triac. Instead, the generator 220 can be a pulse generator that provides control pulses. To assist the pulse generator, the switch control block 205 includes the voltage sense circuit 230. The voltage sense circuit 230, generally, monitors the voltage applied to the switch 215 (i.e., the applied voltage to the auxiliary circuit) and generates pulses based on the applied voltage. For example, the voltage sense circuit 230 can monitor the voltage applied to the triac and generate pulses (also referred to as gating pulses) in relation to the inception of voltage after the zero crossings of the applied voltage. The pulses are applied to the NAND gate 225. The NAND gate 225 decides whether a gating pulse should or should not be applied to the triac switch 215 based on the conditions of the circuit control block 215, the result of which controls current through the triac 215. It is envisioned that the voltage sense circuit 230 and the generator 220 can be designed differently for other types of gate logic and other types of switches (e.g., other types of electronic devices).

Figure 5:
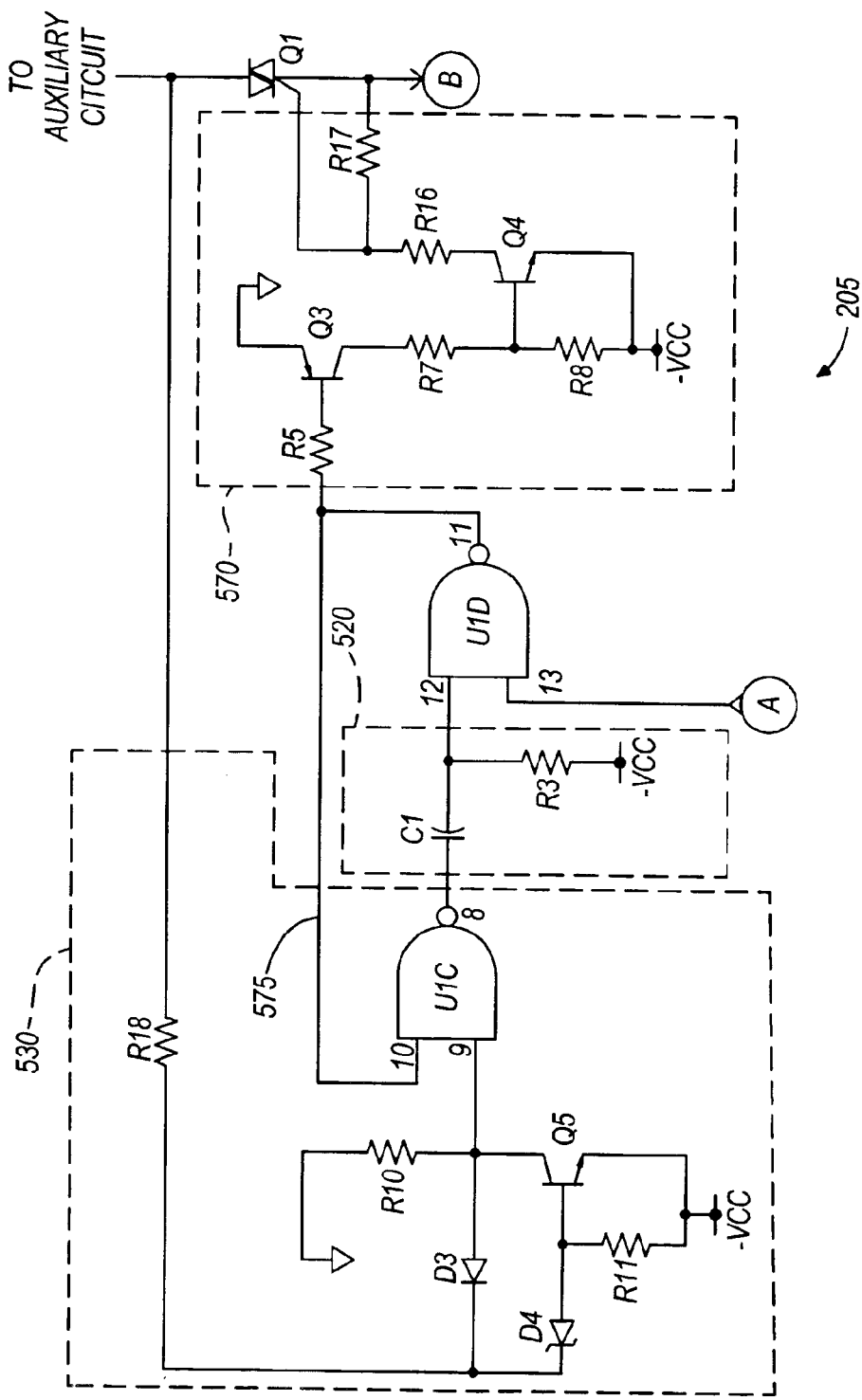
FIG. 5 is an electrical schematic of a portion of the electrical schematic shown in FIG. 4 and, specifically, is an electrical schematic of a voltage sense circuit, a generator circuit, a NAND gate, and a switch driver.

FIG. 5 is a detailed schematic showing one exemplary switch control block including a triac Q1, a triac voltage sense circuit 530, a pulse generator 520, a NAND gate U1D, and a switch driver 570. The triac voltage sense circuit 530 includes resistors R10, R1, R18, and R19; diode D3; Zener diode D4; transistor Q5; and NAND gate U1C. The pulse generator 520 includes capacitor C1 and resistor R3. The output driver 570 includes resistors R5, R7, R8, R16, and R17; and transistors Q3 and Q4.

One method to keep the cost of an electronic circuit as low as possible is to keep the current supplied by the power supply as low as possible. One way to help accomplish this in an electronic switch circuit is to use a triac as the switch 215. A triac has the benefit of being a bidirectional gate controlled thyristor that only requires repetitive pulses to continuously conduct. Therefore, rather than providing a continuous signal to the triac (i.e., via the NAND gate 225), the voltage sense circuit 530 and generator circuitry 520 only need to generate short continuous pulses (e.g., 25 $\mu$s) where each pulse is generated each half cycle of the voltage applied to the triac switch Q1.

With reference to FIG. 5, the voltage sense circuit 530 monitors the voltage across the triac (referred to as the triac voltage) and determines whether the absolute value of the triac voltage is greater than a threshold (e.g., 5V). When the absolute value of the triac voltage is greater than the threshold, a logic 0 is applied to pin 9 of the NAND gate U1C, thereby resulting in a logic 1 being applied to pulse generator 520. The voltage at pin 8 begins charging capacitor C1 and pulls pin 12 high at NAND gate U1D. A logic 1 is applied to pin 12 of U1D for the time constant of capacitor C1 and resistor R3. Therefore, the result of the voltage sense circuit 530 and generator 520 circuitry is that pulses are provided to NAND gate U1D, the pulses are only generated when the triac voltage passes through zero voltage to the positive or negative threshold (i.e., are generated just after each zero crossing event), and the pulses are narrow relative to the AC cycle of the power source. The switch driver 570 drives the triac Q1 based on the output of NAND gate U1D. While not necessary, the switch driver 570 is used because the triac Q1 can float off of ground. The driver 570 prevents voltage from feeding back into NAND gates U1C and U1D if the triac Q1 does float.

A subtle feature of the circuit shown in FIG. 5 relates to the line labeled 575 in FIG. 5. Line 575 locks out the voltage sense circuit 530 when the pulse is being applied to the gate of the triac Q1. This feature makes sure the full current pulse is applied to the triac Q1 and, thus, prevents teasing the triac Q1 ON. More specifically, as the current pulse is applied to the gate, the triac Q1 will start conducting. The voltage across the main terminals of the triac Q1 will go to near zero without line 575. This can fool the voltage sensing circuit 530 into thinking the triac Q1 is fully conducting, and the circuit terminates the current pulse to the gate. Line 575 prevents this by forcing the NAND gate U1C to provide a logic 1 result during the time constant of resistor R3 and C1.

Before proceeding further it should be noted that, in some constructions, the voltage sense circuit 230, generator 220, and NAND gate 225 are not required. That is, the circuit control block 210 (discussed below) can directly control the switch 215.

Referring again to FIG. 2, the electronic switch assembly 100 includes a circuit control block 210. For the construction shown in FIG. 2, the control block 210 includes a latch 235, a startup set circuit 240, a current sense circuit 245, an OR gate 250, and a limit timer 255. The latch 235, which is shown as an SR latch, provides outputs to the switch control block 205 based on values received at the latch inputs, which are shown as inputs S and R. The outputs determine whether the switch 215 is on or off. Other latches and other arrangements for the SR latch can be used (e.g., if NAND gate 225 is replaced by an AND gate).

Figure 6:
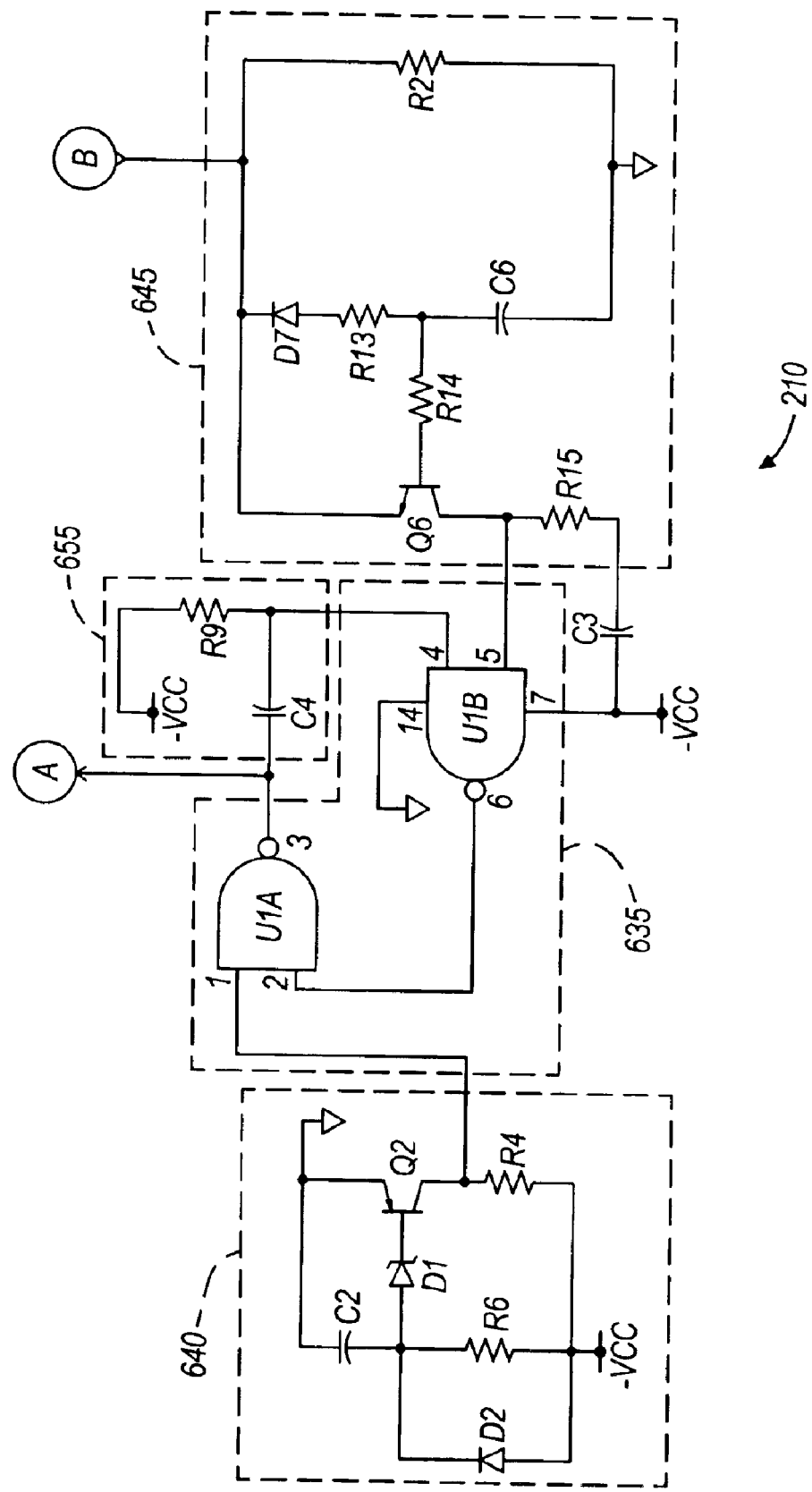
FIG. 6 is an electrical schematic of a portion of the electrical schematic shown in FIG. 4 and, specifically, is an electrical schematic of a start-up set circuit, a timer circuit, a current sense circuit, and a latch circuit.

The startup set circuit 240 sets the latch in the set condition while the motor power supply 200, and consequently the electronic switch assembly, powers up. This ensures that the start winding 110 is energized for at least the duration of the set pulse, and that the current sense circuit 245 (discussed below) stabilizes before it is allowed to open switch 215. An exemplary start-up circuit 640 is shown in FIG. 6. The startup set circuit 640 includes resistors R4 and R6, capacitor C2, diode D2, Zener diode D1, and transistor Q2. The duration of the start-up period is set by how long it takes for capacitor C2 to charge to a voltage greater than the reverse breakdown voltage of Zener diode D1.

There are two ways that the latch 235 can be reset: A) either the magnitude of the current through switch 215 (i.e., through the controlled circuit) is greater than a threshold or a timer times out. For example, if the rotor of the motor was locked on startup, the magnitude of the start winding current would never increase and the start winding would remain connected until the thermal switch protecting the motor finally opens. With this high current flowing continuously in the motor start winding, the triac switch and current sensing resistor (discussed below) would get very hot and would likely fail. To keep circuit costs low, the limit timer is added to terminate the start winding current after a time period (e.g., 1 to 1.5 seconds), whether the motor is started or not. An exemplary timer circuit 655 is shown in FIG. 6 as resistor R9 and capacitor C4, where the period for the timer circuit 655 is determined by the RC time constant of resistor R9 and capacitor C4. The timer changes the value of the signal (e.g., from a logic 0 to a logic 1) provided to the OR gate 250 (FIG. 2) after the time period.

Also provided to OR gate 250 is the result of the current sense circuit 245. Referring again to FIG. 2, the current sense circuit 245 senses the current through the switch 215 and compares the sensed value to a threshold. The result of the OR gate is provided to the latch 235, thereby controlling the latch 235, the NAND gate 225, and ultimately the switch 215. More specifically, if either the current sense circuit 245 or the limit timer 255 generates a logic 1, the SR latch resets, thereby controlling the NAND gate 225 and the switch 210. Before proceeding further, it should be noted that either the timer 255 or the current sense circuit 245 can be removed from the circuit control block 210. Additionally, in other constructions, other sensors or circuits can be used in place of the current sense circuit 245 (e.g., a voltage sensor) and the current sense circuit 245 can sense other circuits (e.g., the main winding circuit) or components.

FIG. 6 is a detailed schematic showing one exemplary circuit control block including set/reset latch circuit 635, startup set circuit 640, timer circuit 655, and current sense circuit 645. The set/reset latch circuit 635 includes NAND gates U1A and U1B. The current sense circuit 645 includes resistors R2, R13, R14, and R15; capacitor C6; diode D7; and transistor Q6. For the current sense circuit, current flows from triac Q1 (FIG. 5) through resistor R2 (FIG. 6). This creates a voltage drop across resistor R2, which is used for sensing. Current from the negative half cycle of the applied power flows through diode D7 and resistor R13 to charge capacitor C6. The charging of capacitor C6 relates to the voltage drop across resistor R2. When the voltage drop across resistor R2 is greater than a threshold, switch Q6 activates and pulls pin 5 of U1B low. This results in the reset of latch 635 and, then, latch 635 provides a logic 0 to NAND gate U1D, thereby deactivating triac Q1.

One feature of the current sense circuit 645 is that the circuit 645 scales the switch-out point based on the initial start winding current. To provide some background, during low line conditions, the start winding current is lower and, during high line conditions, the start winding current is higher. This can potentially create a switch-out speed error. To compensate for this, the first two or three cycles of start winding current charges capacitor C6 up to a value 0.7 volts (i.e., the diode forward drop) less than the peak voltage across the current sensing resistor R2. This sets the trip threshold value for the circuit. When the start winding current magnitude rapidly grows as the motor reaches operating speed, the voltage from base to emitter on transistor Q6 becomes sufficient to turn transistor Q6 ON. Therefore, the current sense circuit 245 scales the switch-out point to detect when the current of the auxiliary circuit flares (i.e., grows rapidly in magnitude).

One feature of the electronic switch assembly shown in FIG. 4 is that the assembly uses only three connections for connecting to the motor. Moreover, each connection is readily available. This reduces the complexity of adding the switch assembly shown in FIG. 4, and potentially reduces assembly time. However, for other constructions, more connections may be required.

As stated earlier and best shown in FIG. 1, the electronic switch assembly 120 can control current through the start winding 110 and the start capacitor 115 of a single-phase, capacitor-start induction motor. In operation, as power is applied to the motor 100, the power supply 200 charges and, when charged, the electronic switch assembly 120 energizes. As the voltage applied to the start winding 110 (and the electronic switch assembly 120) passes through zero, the voltage sense circuit 230 and generator 220 senses voltage on the switch 215 and generates pulses in relation to the inception of voltage after the zero crossings of the voltage. The pulses are provided to NAND gate 225.

The NAND gate 225 receives a control signal from latch 235. Based on the control signal, the NAND gate 225 triggers (or "re-triggers") the switch 215 into conduction. For the construction shown, when the NAND gate 225 receives a logic 1 from the latch 235, the switch 215 conducts, and, when the NAND gate 225 receives a logic 0 from the latch 235, the switch 215 prevents current through the auxiliary circuit.

The startup set circuit 240 forces the switch 215, via the latch 235 and NAND gate 225, to conduct for a time interval after the power supply energizes the electronic switch assembly. The current sense circuit 245 monitors the magnitude of the current flowing through the switch assembly. When the magnitude is greater than a threshold, the current sense circuit 245 forces, via OR gate 250, latch 235, and NAND gate 225, the switch 215 to prevent current flow through the auxiliary circuit (i.e., to "open" switch 215). Should the motor not come up to speed within a time interval, the timer 255 forces, via OR gate 250, latch 235, and NAND gate 225, the switch 215 to prevent current flow through the auxiliary circuit. Preventing current flow through the auxiliary circuit prevents current flow through the start winding 110 and the start capacitor 115.

Figure 7:
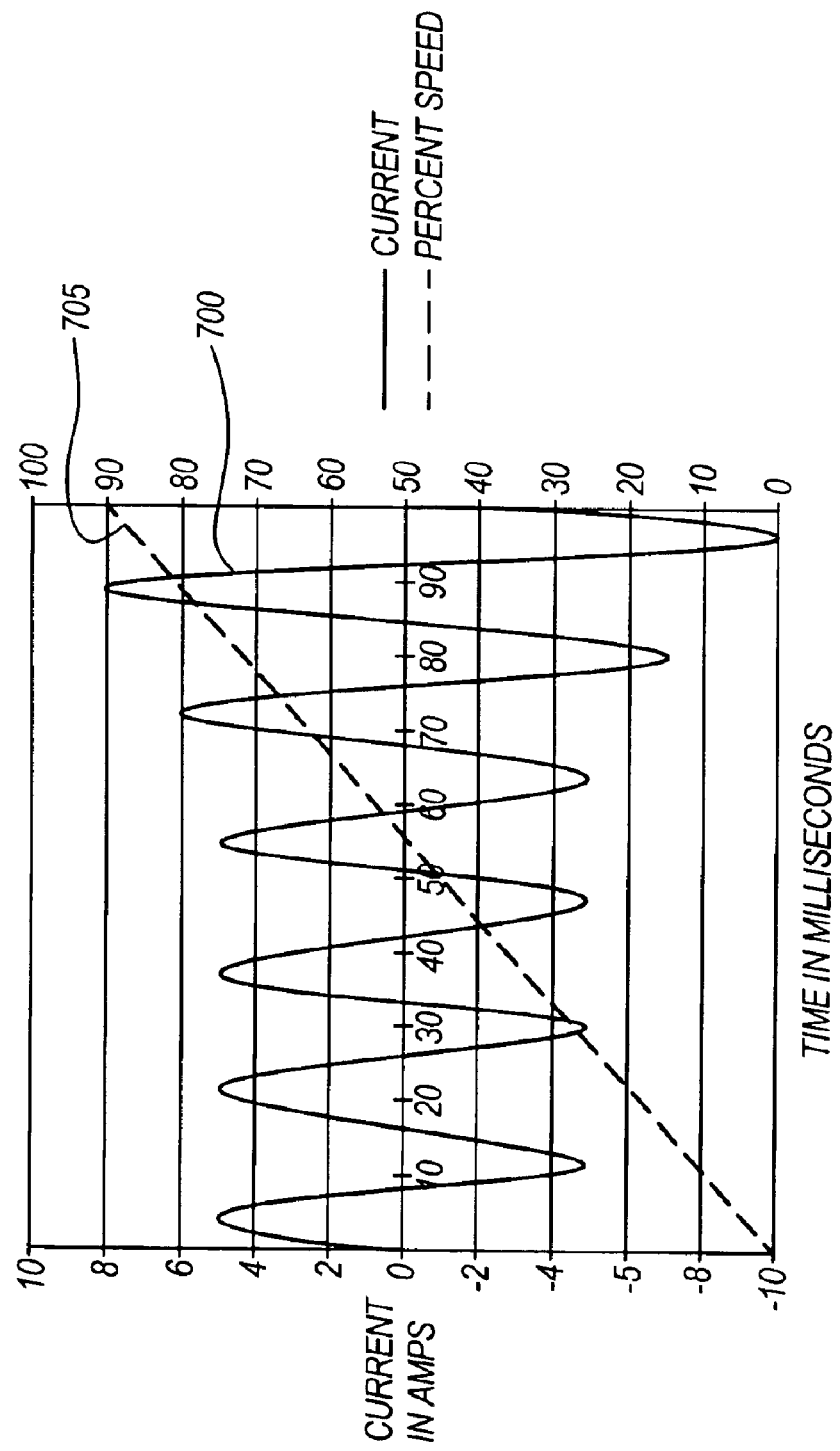
FIG. 7 is a graph comparing a current in Amps through the auxiliary circuit of a single-phase, capacitor-start induction motor against time in milliseconds, and a percent speed of the motor against time in milliseconds.

The electronic switch assembly 120 senses the magnitude of the auxiliary circuit current to determine the appropriate switch-out point for the auxiliary circuit. FIG. 7 shows a representative auxiliary circuit current waveform 700. It can be seen that as the rotor speeds up (waveform 705), the magnitude of the auxiliary circuit current stays relatively constant until the motor nears running speed. As the motor approaches running speed, the magnitude of the current grows rapidly because the start winding is no longer contributing to the output torque, but is rather fighting with the main winding. The electronic switch circuit 120 uses the flaring of the current to its benefit to deactivate the auxiliary circuit and, consequently, the start winding.

Thus, the invention provides, among other things, a new and useful electronic switch assembly and motor having the electronic switch assembly. The embodiments described above and illustrated in the figures are presented by way of example only and are not intended as a limitation upon the concepts and principles of the invention. Various features and advantages of the invention are set forth in the following claims.

What is claimed is:

1. An electronic switch assembly comprising:
    an electronic switch;
    a controller connected to the electronic switch to control the electronic switch; and
    a power supply connectable to a power source and connected to the controller, the power supply being configured to receive power from the power source and controllably power the controller, the power supply including a circuit clamp means connectable to the power source and connected to the controller, the circuit clamp means obstructing power from powering the controller when the voltage of the received power is greater than a threshold.

2. An electronic switch assembly as set forth in claim 1 wherein the circuit clamp means includes a Zener diode, and wherein the threshold is approximately the reverse breakdown voltage of the Zener diode.

3. An electronic switch assembly as set forth in claim 1 wherein the circuit clamp means includes a switch and a Zener diode that controls the switch, wherein the Zener diode promotes a current through the Zener diode when the voltage of the power source is approximately equal to the reverse breakdown voltage of the Zener diode, and wherein the current controls the switch to obstruct the power from powering the controller.

4. An electronic switch assembly as set forth in claim 1 wherein the switch shorts the power supply in response to the current from the Zener diode.

5. An electronic switch assembly as set forth in claim 1 wherein the controller includes a sensor that senses a parameter, and wherein the controller selectively controls the electronic switch based on the parameter.

6. An electric machine connectable to a power supply, the electric machine comprising:
    a rotor;
    a main winding; and
    an auxiliary circuit in a non-series relationship with the main winding, the auxiliary circuit comprising an auxiliary circuit element and an electronic switch assembly electrically connected in a series relationship such that the electronic switch assembly controls current through the auxiliary circuit element, the electronic switch assembly comprising
    an electronic switch;
    a controller connected to the electronic switch to control the electronic switch;
    a power supply connectable to the power source and connected to the controller, the power supply being configured to receive power from the power source and controllably power the controller, the power supply including a circuit clamp connectable to the power source and connected to the controller, the circuit clamp obstructing power from powering the controller when the voltage of the received power is greater than a threshold, thereby preventing current through the auxiliary circuit component.

7. An electric motor as set forth in claim 6 wherein the circuit clamp includes a Zener diode, and wherein the threshold is approximately the reverse breakdown voltage of the Zener diode.

8. An electric machine as set forth in claim 6 wherein the circuit clamp includes a switch and a Zener diode that controls the switch, wherein the Zener diode promotes a current through the Zener diode when the voltage of the power source is approximately equal to the reverse breakdown voltage of the Zener diode, and wherein the current controls the switch to obstruct the power from powering the controller.

9. An electric machine as set forth in claim 6 wherein the switch shorts the power supply in response to the current from the Zener diode.

10. An electric machine as set forth in claim 6 wherein the controller includes a sensor that senses a parameter, and wherein the controller selectively controls the electronic switch based on the parameter.

11. An electric machine as set forth in claim 6 wherein the controller includes a current sensor that senses a current through the switch and wherein the controller selectively controls the electronic switch based on a sensed current.

12. An electric machine as set forth in claim 11 wherein the controller opens the electronic switch when the sensed current is greater than a threshold.

13. An electric machine as set forth in claim 6 wherein the controller includes
a generator that provides a first signal,
a circuit control including a sensor that senses a parameter, the circuit control providing a second signal based on the sensed parameter,
decision logic connected to the generator, the circuit control, and the switch, the decision logic receiving the first and second signals and generating a control signal that selectively controls the electronic switch based on the first and second signals.

14. An electric machine as set forth in claim 13 wherein the switch includes a triac, and wherein the first signal includes a plurality of pulses.

15. An electric machine as set forth in claim 14 wherein the controller further includes a voltage sense circuit including a sensor that senses the voltage across the triac.

16. An electric machine as set forth in claim 15 wherein the pulses have a relation to the zero crossings of the sensed voltage.

17. An electric machine as set forth in claim 13 wherein the circuit control includes a timer, and wherein the circuit control provides the second signal based on the sensed parameter and the timer.

18. An electric machine as set forth in claim 17 wherein the control signal opens the switch when the timer times a period.

19. An electric machine as set forth in claim 18 wherein the control signal opens the switch when the sensed parameter is greater than a threshold.

20. An electric machine as set forth in claim 19 wherein the circuit control includes a delay preventing the opening of the switch during a second time period.

21. An electric machine as set forth in claim 19 wherein the sensor is a current sensor and the parameter a current through the switch.

22. An electric machine as set forth in claim 13 wherein the control signal opens the switch when the sensed parameter is greater than a threshold.

23. An electric machine as set forth in claim 22 wherein the sensor is a current sensor and the parameter is a current through the switch.

24. An electric machine as set forth in claim 6 wherein the auxiliary circuit element comprises at least one of a capacitor and an auxiliary winding.

25. A method of controlling an electric machine with power from a power source, the electric machine comprising a rotor, a main winding circuit comprising a main winding, and an auxiliary circuit connected in a parallel relationship with the main winding circuit, the auxiliary circuit comprising an auxiliary circuit element and an electronic switch assembly electrically connected in a series relationship such that the electronic switch assembly controls current through the auxiliary circuit element, the electronic switch assembly including an electronic switch, a controller connected to the electronic switch to control the electronic switch, and a power supply connected to the power source and the controller, the method comprising the acts of:
connecting the electronic switch assembly to the power source;
powering the power supply;
determining at the power supply whether the voltage of the power is greater than a value;
obstructing the power from powering the controller when the voltage is greater than the value, and
preventing current through the auxiliary circuit component in response to the obstructing act.

26. A method as set forth in claim 25 wherein the electric machine is a motor and wherein the method further comprises preventing the motor from starting in response to preventing current through the winding.

27. A method as set forth in claim 26 wherein obstructing power from powering the controller includes shorting the power supply.

28. A method as set forth in claim 25 wherein obstructing power from powering the controller includes shorting power supply.

29. A method of controlling an electric machine with power from a power source, the electric machine comprising a rotor, a main winding, and an auxiliary circuit connected in a non-series relationship with the main winding, the auxiliary circuit comprising an auxiliary circuit element and a switch assembly electrically connected in a series relationship such that the switch assembly controls the current through the auxiliary circuit element, the switch assembly including a switch and a controller connect to the electronic switch to control the electronic switch, the method comprising the acts of:
connecting the motor to the power source;
allowing current through the electronic switch;
monitoring the current; and
preventing current through the electronic switch when the monitored current flares.

30. A method as set forth in claim 29 wherein monitoring the current includes sensing the current, and determining a threshold based on an initial sensed current.

31. A method as set forth in claim 30 wherein preventing current through the electronic switch includes comparing the sensed current with the threshold.

32. A method as set forth in claim 31 wherein preventing current through the electronic switch includes preventing flow of the current through the electronic switch when the sensed current is greater than the threshold.

33. A method as set forth in claim 29 wherein the switch includes an electronic switch.

34. A method as set forth in claim 33 wherein the electronic switch includes a triac.

35. A method as set forth in claim 34 wherein allowing current through the electronic switch includes pulsing the triac.

36. A method as set forth in claim 35 wherein the method further includes monitoring the voltage of the power provided to the switch assembly and pulsing the triac based on the monitored voltage.

37. A method as set forth in claim 35 wherein monitoring the voltage of the power includes monitoring the voltage for zero crossings and pulsing the triac in relation to the zero crossings.

38. An electric machine connectable to a power supply, the electric machine comprising:
   a rotor;
   a main winding circuit comprising a main winding, and
   an auxiliary winding circuit connected in a parallel relationship with the main winding circuit, the auxiliary winding circuit comprising an auxiliary circuit element and a switch assembly connected in a series relationship such that the switch assembly controls the current through the auxiliary circuit element, the switch assembly comprising
      a switch,
      a controller connected to the switch to control the switch, the controller comprising a current sensor that senses a current through the switch, a scalar that generates a threshold based on the sensed current, and decision logic that controls the switch based on the sensed current and the threshold;
   wherein the scalar generates a threshold having a relation to the sensed current such that the decision logic detects when the sensed current flares.

39. An electric machine as set forth in claim 38 wherein the current sensor includes a resistor.

40. An electric machine as set forth in claim 39 wherein the scalar includes a capacitor that charges to a voltage having a relation to the current through the resistor, the charged voltage having a relation to the threshold, and a switch that provides a signal to the decision logic when the voltage drop across the resistor is greater than the threshold.

41. An electric machine as set forth in claim 38 wherein the switch includes an electronic switch.

42. An electric machine as set forth in claim 41 wherein the switch assembly further includes a power supply connectable to the power source and connected to the controller, the power supply being configured to receive power from the power source and controllably power the controller, the power supply including a circuit clamp that obstructs power from powering the controller when the voltage of the received power is greater than a threshold, thereby preventing current through the winding.

43. An electric machine as set forth in claim 42 wherein the decision logic opens the electronic switch when the sensed current is greater than a threshold.

44. An electric machine as set forth in claim 38 wherein the controller further includes a generator that provides a signal, and wherein the decision logic controls the switch further based on the generated signal.

45. An electric machine as set forth in claim 44 wherein the switch includes a triac, and wherein the first signal includes a plurality of pulses.

46. An electric machine connectable to a power supply, the electric machine comprising:
   a rotor;
   a main winding; and
   an auxiliary circuit connected in a non-series relationship with the main winding, the auxiliary circuit comprising an auxiliary circuit component and an electronic switch assembly electrically connected in a series relationship such that the electronic switch assembly controls the current through the auxiliary circuit element, the electronic switch assembly comprising
      an electronic switch,
      a generator that provides a first signal,
      a circuit control including a current sensor that senses a current through the electronic switch, the circuit control providing a second signal based on the sensed current,
      decision logic connected to the generator, the circuit control and the electronic switch, the decision logic receiving the first and second signals and generating a control signal that selectively controls the electronic switch based on the first and second signals.

47. An electric machine as set forth in claim 46 wherein the electronic switch includes a triac, and wherein the first signal includes a plurality of pulses.

48. An electric machine as set forth in claim 47 wherein the control circuit further includes a voltage sense circuit including a senor that senses the voltage across the triac.

49. An electric machine as set forth in claim 48 wherein the pulses have a relation to the zero crossings of the sensed voltage.

50. An electric machine as set forth in claim 46 wherein the circuit control includes a timer, and wherein the circuit control provides the second signal based on the sensed current and the timer.

51. An electric machine as set forth in claim 50 wherein the control signal opens the switch when the timer times a period.

52. An electric machine as set forth in claim 51 wherein the control signal opens the switch when the sensed current is greater than a threshold.

53. An electric machine as set forth in claim 52 wherein the circuit control includes a delay preventing the opening of the switch during a second time period.

54. An electric machine as set forth in claim 46 wherein the control signal opens the switch when the sensed current is greater than a threshold.

* * * * *